(12) United States Patent
Inukai (10) Patent No.: US 8,193,833 B2
(45) Date of Patent: Jun. 5, 2012

(54) SEMICONDUCTOR INTEGRATED CIRCUIT FOR MONITORING CHARACTERISTICS OF A SEMICONDUCTOR CHIP

(75) Inventor: Takashi Inukai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/886,685

(22) Filed: Sep. 21, 2010

(65) Prior Publication Data
US 2011/0193594 A1    Aug. 11, 2011

(30) Foreign Application Priority Data
Feb. 10, 2010   (JP) .................................. 2010-28117

(51) Int. Cl.
*H03K 19/20*   (2006.01)
*H03K 19/094*  (2006.01)
*H03K 3/00*    (2006.01)
*H03B 1/00*    (2006.01)

(52) U.S. Cl. ...................................................... 326/112

(58) Field of Classification Search ............. 326/80–83, 326/102, 104, 112, 119, 121; 327/108, 109
See application file for complete search history.

(56) References Cited

U.S. PATENT DOCUMENTS

| | | | | |
|---|---|---|---|---|
| 5,999,019 A * | 12/1999 | Zheng et al. | ........... | 326/98 |
| 7,403,037 B2 * | 7/2008 | Haraguchi | ............... | 326/83 |
| 7,978,274 B2 * | 7/2011 | Umezaki et al. | ............... | 349/42 |
| 2007/0146036 A1 * | 6/2007 | Kwon | ........................ | 327/285 |
| 2008/0062112 A1 * | 3/2008 | Umezaki | ................. | 345/100 |
| 2009/0134926 A1 * | 5/2009 | Yoon et al. | .................... | 327/295 |
| 2010/0039154 A1 | 2/2010 | Yamashita | | |

FOREIGN PATENT DOCUMENTS

JP    11-101851    4/1999

OTHER PUBLICATIONS

Tschanz, et al. Effectiveness of Adaptive Supply Voltage and Body Bias for Reducing Impact of Parameter Variations in Low Power and High Performance Microprocessors, IEEE Journal of Solid-State Circuits, May 2003, vol. 38, No. 5, pp. 826-829.

* cited by examiner

*Primary Examiner* — Shawki S Ismail
*Assistant Examiner* — Dylan White
(74) *Attorney, Agent, or Firm* — Turocy & Watson, LLP

(57) ABSTRACT

Provided is a semiconductor integrated circuit that includes a monitoring circuit for monitoring characteristics of a semiconductor chip. The semiconductor integrated circuit comprises a first terminal with a first voltage and a second terminal with a second voltage. The semiconductor integrated circuit also comprises an inverter chain circuit comprising a plurality of inverters connected in cascade. Each of the plurality of inverters includes a first transistor and a second transistor. The first transistors included in the inverters located at either odd-number orders or even-number orders counted from an input terminal side of an inverter chain circuit function as pre-charge transistors. The pre-charge transistors have a conductivity type different from a conductivity type of the first transistors other then the pre-charge transistors.

13 Claims, 8 Drawing Sheets

NMOS Delay Circuit

PMOS Delay Circuit

FIG. 7    NMOS Delay Circuit

SEMICONDUCTOR INTEGRATED CIRCUIT FOR MONITORING CHARACTERISTICS OF A SEMICONDUCTOR CHIP

CROSS REFERENCE TO RELATED APPLICATIONS

This application is based on and claims the benefit of priority from Japanese Patent Application No. 2010-28117, filed on Feb. 10, 2010, the entire contents of which are incorporated herein by reference.

BACKGROUND

1. Field

Embodiments described herein relate generally to a semiconductor integrated circuit, and particularly to a semiconductor integrated circuit including a monitor circuit for monitoring characteristic of a semiconductor chip.

2. Description of the Related Art

Various kinds of measuring devices are already known as a configuration for measuring performance of a semiconductor integrated circuit formed on a semiconductor substrate.

In addition, a device is also known that measures characteristic (e.g., leakage current) of transistors in a semiconductor integrated circuit, and based on the measurement result, controls a supply voltage and a substrate bias of the semiconductor integrated circuit to suppress dispersion between the transistors in the characteristic.

As a method for measuring characteristic of transistors formed on a semiconductor substrate, a method of providing a four-terminal transistor to function as a process monitor on a dicing line of a chip is sometimes used. However, according to this method, it is necessary to provide a dedicated measuring device outside the chip. The dedicated measuring device is configured to connect to a transistor on the dicing line to measure performance of the transistors. Moreover, this method has a problem that it is difficult to specify the position of the transistor after the chip is diced.

Hence, as a method for measuring performance of transistors, there is used a method of providing a monitor circuit configured as a ring oscillator or a delay chain on the chip together with a semiconductor integrated circuit. However, a measuring device that measures characteristic of transistors by using a ring oscillator is influenced by the rise time and fall time of both NMOS transistors and PMOS transistors. Therefore, this device cannot detect characteristic of NMOS transistors and PMOS transistors separately.

DETAILED DESCRIPTION

A semiconductor integrated circuit according to one embodiment includes a first terminal supplied with a first voltage, a second terminal supplied with a second voltage having a value different from that of the first voltage, and an inverter chain circuit including a plurality of inverters connected in cascade. Each of the plurality of inverters includes: a first transistor having one end connected to the first terminal; and a second transistor having one end connected to the second terminal and the other end connected to the other end of the first transistor. The plurality of inverters are connected in cascade with an output terminal of the inverter at a preceding stage connected to a control terminal of the second transistor in the inverter at a succeeding stage.

The first transistors included in the inverters located at either odd-number orders or even-number orders counted from an input terminal side of the inverter chain circuit function as pre-charge transistors configured to become conductive when a pre-charge signal has a first state to pre-charge the other end of the first transistors and to become non-conductive when the pre-charge signal has a second state. The first transistors other than the pre-charge transistors are configured to become non-conductive when the pre-charge signal has the first state and to become conductive when the pre-charge signal has the second state.

Embodiments of the present invention will now be explained in detail with reference to the drawings.

[First Embodiment]

A semiconductor integrated circuit according to a first embodiment of the present invention will now be explained with reference to FIG. 1.

Figure 1:
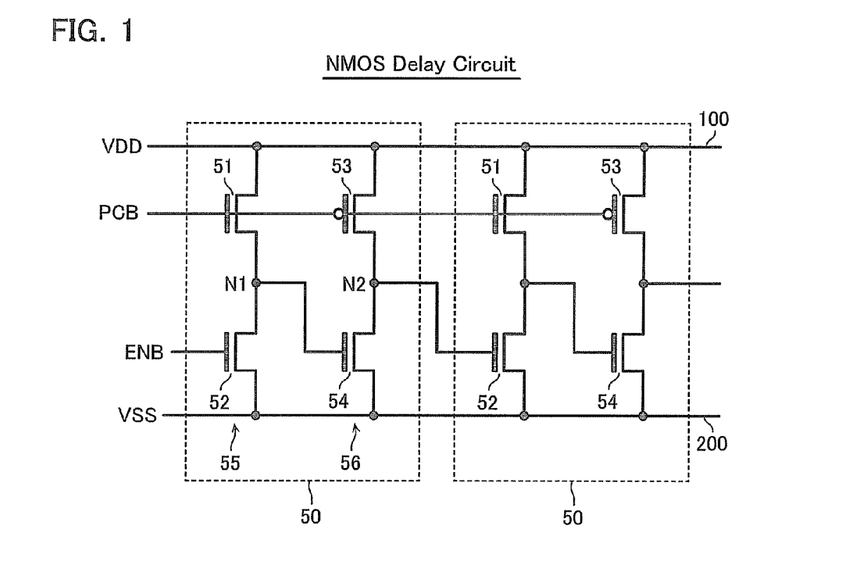
FIG. 1 is an equivalent circuit diagram showing configuration of an NMOS delay circuit 50 according to a first embodiment.

FIG. 1 is an equivalent circuit diagram showing configuration of an NMOS delay circuit 50 according to a semiconductor integrated circuit of the first embodiment. The NMOS delay circuit 50 is a circuit used for evaluating characteristic of NMOS transistors included therein. Specifically, the NMOS delay circuit 50 is a circuit configured to execute a pre-charge operation of making pre-charge transistors conductive to pre-charge some nodes up to a certain voltage (hereinafter, referred to as pre-charge operation), and then to execute a signal propagation operation of making evaluation-target NMOS transistors propagate a signal by making them into conductive in order to evaluate characteristic of the evaluation-target NMOS transistors. Though not particularly shown in the drawings, wells of PMOS transistors may be supplied with a supply voltage VDD fixedly or with a voltage that is adjustable in accordance with an output of a bias adjusting circuit. Likewise, wells of NMOS transistors may be supplied with a ground voltage VSS fixedly or with a voltage adjustable in accordance with an output of a bias adjusting circuit.

As shown in FIG. 1, the NMOS delay circuit 50 includes four transistors 51 to 54, and hence includes two inverters 55 and 56. A plurality of such NMOS delay circuits 50 each including four transistors 51 to 54 (two inverters 55 and 56) are connected in cascade, thus configuring an inverter chain circuit (in FIG. 1, only four inverters and two NMOS delay circuits are shown). Since the plurality of NMOS delay circuits 50 have the same configuration, the configuration of the first NMOS delay circuit 50 will be explained below.

The transistors 51, 52, and 54 are all NMOS transistors. The transistors 51 and 52 are connected in series between a supply voltage terminal 100 (first terminal) for supplying a supply voltage VDD (first voltage) and a ground terminal 200 (second terminal) for supplying a ground voltage VSS (second voltage) (the transistors 51 and 52 are connected such that a current path becomes serial), thus configuring one inverter 55. An inverted pre-charge signal PCB, which is an inverted signal of a pre-charge signal PC, is supplied to the gate of the transistor 51. The inverted pre-charge signal PCB becomes "L" (ground voltage VSS) during a pre-charge operation.

On the other hand, an inverted enable signal ENB, which is an inverted signal of an enable signal EN for starting a signal propagation operation of the inverter chain circuit, is input to the gate of the transistor 52 at the first stage. The inverted enable signal ENB becomes "L" (ground voltage VSS) during a signal propagation operation. In the following explanation, the term "pre-charge" is used in a broadly-defined meaning which includes not only an operation of changing the voltage of a given node from a lower voltage to a higher voltage (i.e., "pre-charge" in the narrowly-defined meaning), but also an operation of changing a given node from a higher voltage to a lower voltage conversely (i.e., "pre-discharge").

The transistor 53 is a PMOS transistor. The transistor 53 and the transistor 54 are connected in series between the supply voltage terminal 100 and the ground terminal 200 to configure another inverter 56. An output terminal N1 of the inverter 55 at the preceding stage is connected to the gate (control terminal) of the transistor 54 in the inverter 56 at the succeeding stage. An output terminal N2 of the succeeding inverter 56 is connected to the gate of the transistor 52 of the NMOS delay circuit 50 at the next stage. The inverted pre-charge signal PCB is supplied to the gate of the transistor 53, which hence becomes conductive (ON) during the pre-charge operation to charge (pre-charge) a node N2 up to the supply voltage VDD. That is, the gate of the transistor 53 is commonly connected to the gate of the transistor 51.

On the other hand, in a signal propagation operation after the pre-charge operation is completed, the inverted pre-charge signal PCB becomes "H" (supply voltage VDD), and hence the transistor 53 becomes non-conductive (OFF). The inverted pre-charge signal PCB and the inverted enable signal ENB are switched by a control circuit not shown in FIG. 1.

Figure 2:
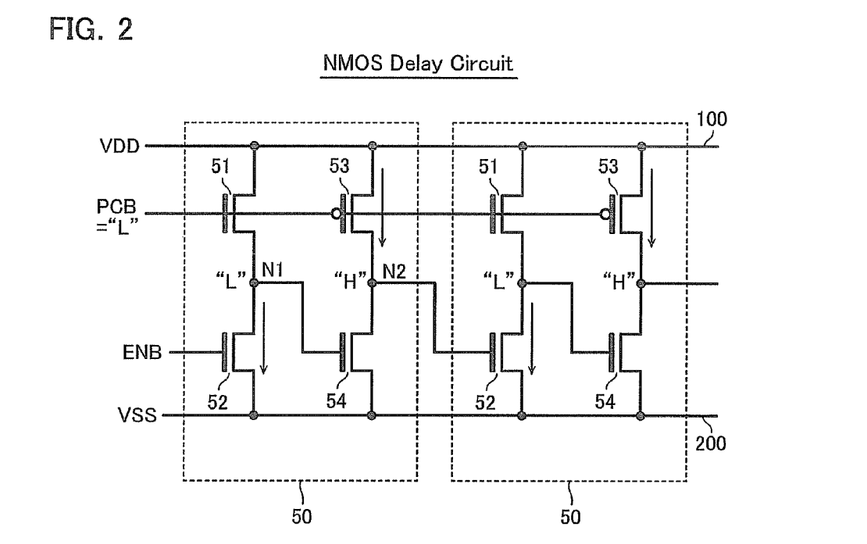
FIG. 2 shows an operation of the NMOS delay circuit 50 according to the first embodiment.

Next, an operation of the NMOS delay circuit 50 will be explained with reference to FIG. 2 and FIG. 3. FIG. 2 shows a pre-charge operation, and FIG. 3 shows a signal propagation operation after the pre-charge operation shown in FIG. 2 is completed.

In the pre-charge operation, the inverted pre-charge signal PCB is set to "L" while the inverted enable signal ENB is set to "H". Hence, the transistor 53 in each NMOS delay circuit 50 becomes conductive. Meanwhile, the transistor 51 becomes non-conductive and the transistor 52 becomes conductive. Hence, a node N1 becomes "L" (ground voltage VSS), and the transistor 54 switches to a non-conductive state upon this voltage change of the node N1. In response to this, the node N2 becomes "H". In this way, the nodes N1 and N2 in the succeeding NMOS delay circuits 50 switch to "L" and "H" respectively one after another. As long as the transistors 53 functioning as pre-charge transistors are conductive, the transistors 54 connected in series to the transistors 53 become non-conductive one after another, and the nodes N2 in the respective NMOS delay circuits 50 are hence charged up to "H" (supply voltage VDD) one after another.

Figure 3:
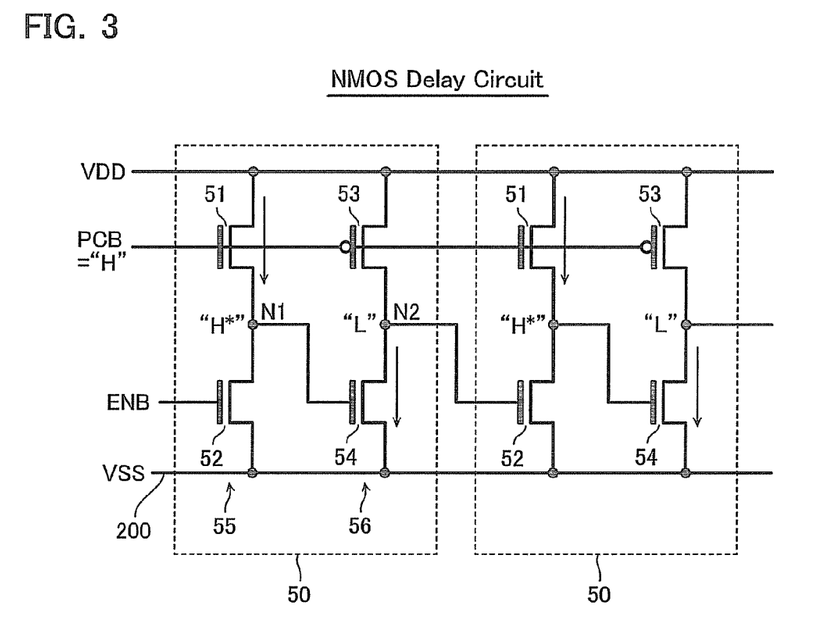
FIG. 3 shows an operation of the NMOS delay circuit 50 according to the first embodiment.

Meanwhile, in the signal propagation operation after the pre-charge operation is completed, the inverted pre-charge signal PCB is switched to "H" and the inverted enable signal ENB is switched to "L" as shown in FIG. 3. The transistor 51 becomes conductive while the transistor 52 becomes non-conductive, whereby the node N1 rises from "L" in the pre-charge operation to "H*" (=VDD-Vth (Vth is the threshold voltage of the NMOS transistor)) and the transistor 54 becomes conductive. The transistor 53 becomes non-conductive. Hence, the node N2 switches from "H" in the pre-charge operation to "L". The nodes N1 and N2 of the NMOS delay circuits 50 at and after the second stage also switch to "H*" and "L" respectively one after another, thereby propagating a signal.

As shown in FIG. 3, in the signal propagation operation of the NMOS delay circuit 50, the pre-charge PMOS transistor 53 remains non-conductive, and the NMOS transistor 51 becomes conductive. The NMOS transistor 52 becomes non-conductive, whereby the node N1 becomes "H*" and the node N2 consequently becomes "L". The nodes N1 and N2 of the succeeding NMOS delay circuits 50 also switch to "H*" and "L" one after another.

If a conventional ordinary inverter chain circuit in which also the transistor 51 is configured by a PMOS transistor is operated in the same way, a current flows also through the PMOS transistor in the signal propagation operation. Hence, even if a signal waveform output by such an inverter chain is analyzed, it is impossible to accurately know characteristic of NMOS transistors.

In this regard, according to the present embodiment, in the signal propagation operation, only the NMOS transistors 51 and 54 contribute to the signal propagation as described above (the PMOS transistor 53 does not contribute to the signal propagation). Hence, by, for example, measuring a change of the output signal of the inverter chain circuit of FIG. 1, which change is to occur after the enable signal EN is switched, it is possible to measure (monitor) characteristic of the NMOS transistors. In addition, according to the present embodiment, the transistor 53 responsible for pre-charging can charge the node N2 fully up to the supply voltage VDD without causing a Vth-drop, because the transistor 53 is configured by a PMOS transistor.

In sum, according to the present embodiment, the transistors 53, which are included in the inverters located at even-number orders counted from the input terminal side among the plurality of inverters configuring the inverter chain circuit, are configured by PMOS transistors, which are to function as pre-charge transistors configured to become conductive during a pre-charge operation and then to become non-conductive during a following signal propagation operation (i.e., during an operation of measuring characteristic of NMOS transistors). The transistors 51, 52, and 54 other than the transistors 53 are all NMOS transistors, and only the NMOS transistors 51 and 54 become conductive in the signal propagation operation after pre-charging is completed. Hence, by measuring the operation of this inverter chain circuit, it is possible to accurately know characteristic of NMOS transistors.

Next, the configuration of an NMOS monitor circuit 1001 using this NMOS delay circuit will be explained with reference to FIG. 4. The NMOS monitor circuit 1001 includes two lines of inverter chain circuits 501 and 502 (first and second signal delay circuits) each configured by concatenating a plurality of such NMOS delay circuits 50 as described above. Other than these, the NMOS monitor circuit 1001 includes buffer circuits 60A and 608, gate circuits 70A and 70B, a sequential circuit 80, output buffers 90 and 91, delay circuits 110A and 110B, gate circuits 120A and 120B, and buffer circuits 130 and inverters 131.

The buffer circuit 60A has a function of propagating a signal output from an output terminal of the inverter chain circuit 501 to a circuit at the succeeding stage. Since the buffer circuit 60B has the same configuration as the buffer circuit 60A, explanation will not be given thereon.

The buffer circuit 60A includes PMOS transistors 61 and 62, NMOS transistors 63 and 64, and an inverter 65. The source of the NMOS transistor 63 is grounded, the gate thereof is connected to the output terminal of the inverter chain circuit 501, and the drain thereof is connected to an input terminal of the inverter 65.

The transistors 61 and 62 are connected in series between a supply voltage terminal and the input terminal of the inverter 65. The transistors 61 and 62 become conductive when the inverted enable signal ENB is "L". At the timing when a pre-charge operation is completed, i.e., at the timing when a signal propagation operation is started, the output signal of the inverter chain circuit 501 is "H", and hence the transistor 63 is conductive. At this time, the transistors 61 and 62 are also conductive. The drive powers of the transistors 61, 62, and 63 are adjusted such that the output of the transistor 63 becomes "L*" (which is lower than VSS+Vth (Vth is the logical threshold voltage of the inverter 65)).

The signal propagation operation proceeds and when the output signal of the inverter chain circuit 501 switches from "H" to "L", the transistor 63 switches to a non-conductive state and the input terminal of the inverter 65 switches to "H". In this way, the output signal of the inverter chain circuit 501 is propagated to the succeeding circuit (70A).

On the other hand, when the inverted enable signal ENB is "H", the transistors 61 and 62 become non-conductive. The NMOS transistor 64 becomes conductive when the inverted enable signal ENB is "H", thereby resetting the input terminal of the inverter 65 to "L".

The gate circuit 70A includes an inverter 71 and a NAND gate 72. The inverter 71 receives the inverted enable signal ENB as an input, and an output terminal of the inverter 71 is connected to one input terminal of the NAND gate 72. On the other hand, the gate circuit 70B is configured by a NOR gate 73, and receives the inverted enable signal ENB at one input terminal thereof and an output signal of the buffer circuit 60B at the other input terminal thereof. The gate circuits 70A and 70B are provided for resetting an S-R flip-flop circuit in the sequential circuit 80 to an initial state in accordance with the inverted enable signal ENB.

The sequential circuit 80 is configured by an S-R flip-flop circuit formed of cross-coupled NAND gates. The sequential circuit 80 is supplied with the output signals of the gate circuits 70A and 703 via inverters, and based on these input signals, determines the states to retain (output signals) Q and QB. The output signals Q and QB are externally output via inverters 90 and 91 as output signals of the NMOS monitor circuit 1001. The output signals Q and QB are also supplied to the delay circuits 110A and 110B.

The delay circuits 110A and 110B are each configured by an inverter chain circuit including a plurality of inverters connected in cascade. The gate circuits 120A and 120B pass the output signals of the delay circuits 110A and 110B therethrough when the enable signal EN is "H". The buffer circuits 130 and the inverters 131 transfer the output signals of the gate circuits 120A and 120B to the inverter chain circuits 501 and 502 by inverting or maintaining the output signals.

Figure 4:
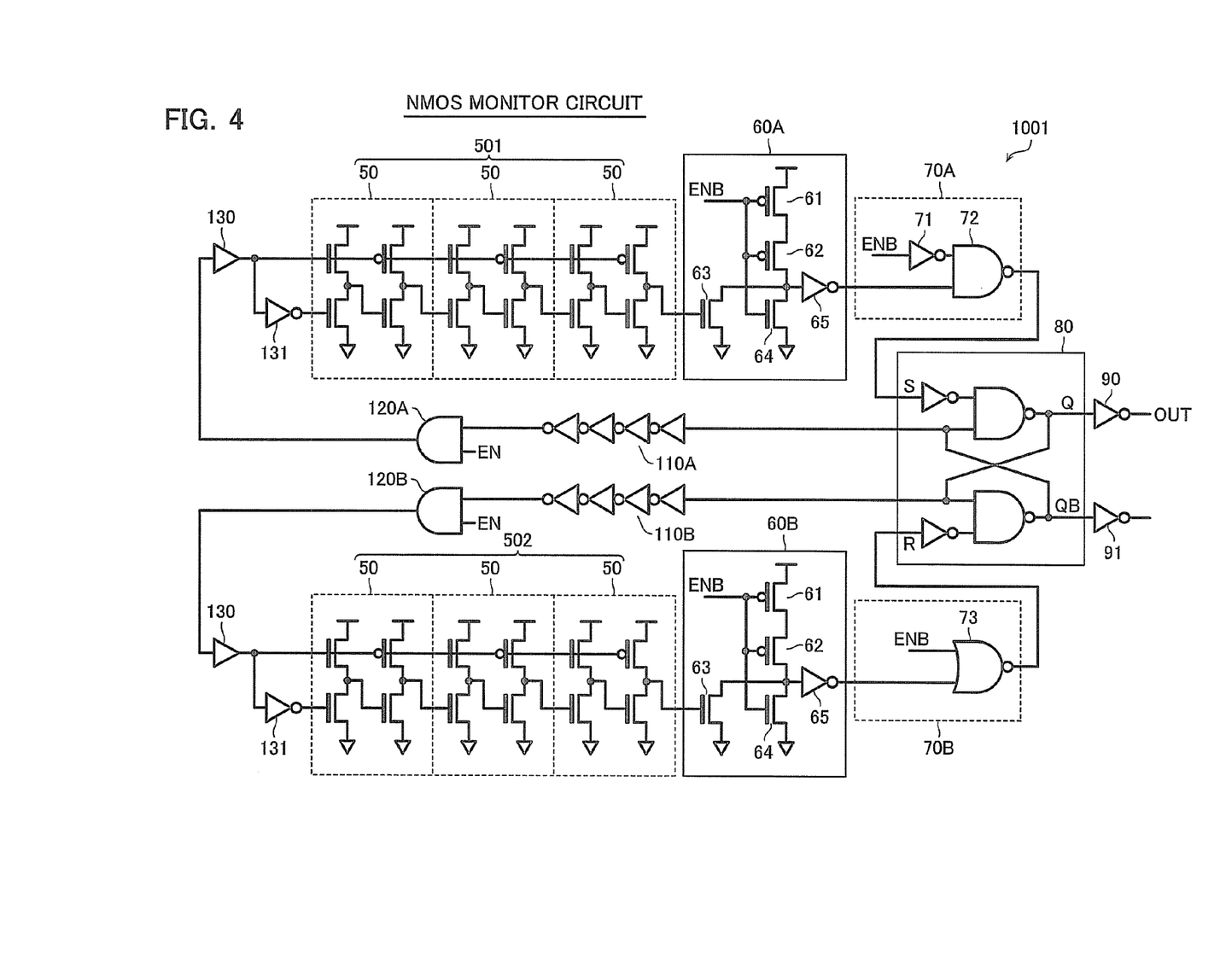
FIG. 4 shows an application example of the NMOS delay circuit 50.

The circuit configuration of FIG. 4 allows one of the inverter chain circuits 501 and 502 to be in signal propagation operation while the other is in a pre-charge operation, which brings about a state that the pre-charge time of one of the inverter chain circuits 501 and 502 is concealed by the operation of the other. The pre-charge operation is naturally influenced by the characteristic of the PMOS transistors since the pre-charge operation is executed by inducing a current through the PMOS transistors. However, one of the inverter chain circuits 501 and 502 executes a pre-charge operation while the other circuit executes a signal propagation operation, and this signal propagation operation is the target of evaluation. Therefore, the pre-charge operation does not influence the output signal of the NMOS monitor circuit 1001. Therefore, it is possible to evaluate characteristic of NMOS transistors without being influenced by the characteristic of PMOS transistors.

The inverter chain circuits 501 and 502 need to be designed such that the signal propagation speed of the transistors 52 and 53 during a pre-charge operation is higher than the signal propagation speed of the transistors 51 and 54 during a signal propagation operation. This is because, with this design, the characteristic of PMOS transistors does not influence the output signal of the NMOS monitor circuit 1001. When the inverter chain circuits 501 and 502 have the same configuration, the former speed is normally higher than the latter speed for a reason related to threshold reduction mentioned above. If the former speed might be lower than the latter speed due to any other external condition, it is possible to design the inverter chain circuits to be able to obtain the desired speeds by, for example, changing the transistor size, etc.

[Second Embodiment]

Next, a semiconductor integrated circuit according to a second embodiment of the present invention will be explained with reference to FIG. 5. The first embodiment concerns an NMOS delay circuit for measuring characteristic of NMOS transistors, while the second embodiment concerns a PMOS delay circuit for measuring characteristic of PMOS transistors.

Figure 5:
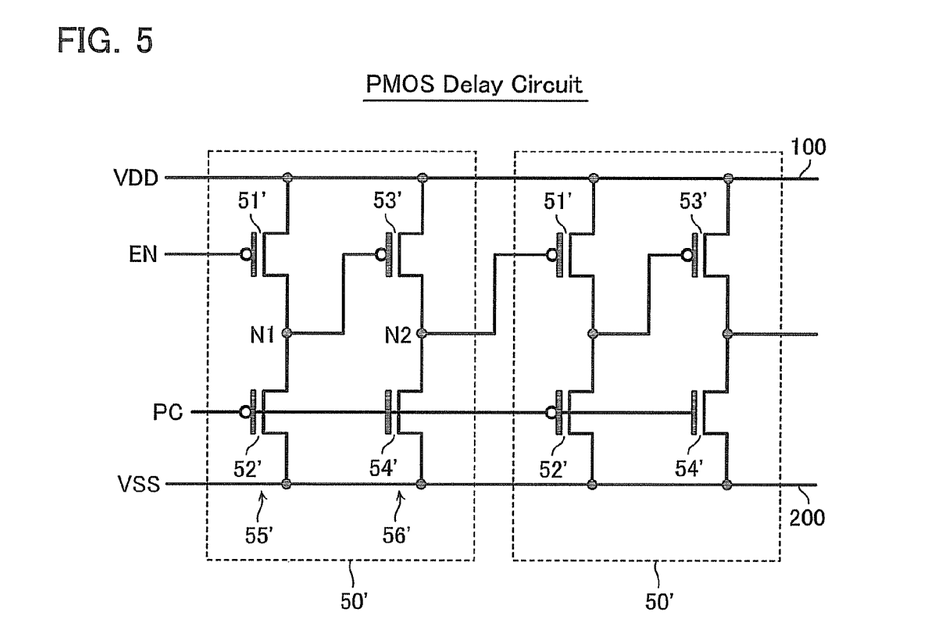
FIG. 5 is an equivalent circuit diagram showing configuration of a PMOS delay circuit 50' according to a second embodiment.

FIG. 5 is an equivalent circuit diagram showing the configuration of a PMOS delay circuit 50' according to a semiconductor integrated circuit of the second embodiment. As shown in FIG. 5, the PMOS delay circuit 50' includes four transistors 51' to 54'. A plurality of such PMOS delay circuits 50' each including four transistors 51' to 54' are connected in cascade, thus configuring an inverter chain circuit. The PMOS delay circuit 50' has a configuration obtained by replacing all the NMOS transistors in the NMOS delay circuit 50 with PMOS transistors and all the PMOS transistors with NMOS transistors, and basically has the same operation principle. Since all of the plurality of PMOS delay circuits 50' have the same configuration, the configuration of the first PMOS delay circuit 50' will be explained below.

The transistors 51', 52', and 53' are all PMOS transistors. The transistors 51' and 52' are connected in series between a supply voltage terminal 100 (second terminal) for supplying a supply voltage VDD (second voltage) and a ground terminal 200 (first terminal) for supplying a ground voltage VSS (first voltage) (the transistors 51' and 52' are connected such that a current path becomes serial), thus configuring one inverter 55'. A pre-charge signal PC is supplied to the gate of the transistor 52'. This signal PC becomes "H" (supply voltage VDD) during a pre-charge operation. On the other hand, an enable signal EN for starting the operation of the inverter chain circuit is input to the gate of the transistor 51'. The enable signal EN becomes "H" (supply voltage VDD) during a signal propagation operation.

On the other hand, the transistor 54' is an NMOS transistor. The transistor 53' and the transistor 54' are connected in series between the supply voltage terminal 100 and the ground terminal 200 to configure another inverter 56'. An output terminal N1 of the inverter 55' at the preceding stage is connected to the gate (control terminal) of the transistor 53' in the inverter 56' at the succeeding stage. An output terminal N2 of the succeeding inverter 56' is connected to the gate of the transistor 51' in the succeeding PMOS delay circuit 50'. The transistor 54' becomes conductive during a pre-charge operation with the pre-charge signal PC supplied to the gate thereof, thus discharging (pre-charging) the node N2 down to the ground voltage VSS. That is, the gate of the transistor 54' is commonly connected to the gate of the transistor 52'. On the other hand, the transistor 53' becomes conductive during a signal propagation operation after the pre-charge operation is completed, with the node Ni becoming "L*" (=VSS+|Vth| (Vth is the threshold voltage of the PMOS transistor)).

Figure 6:
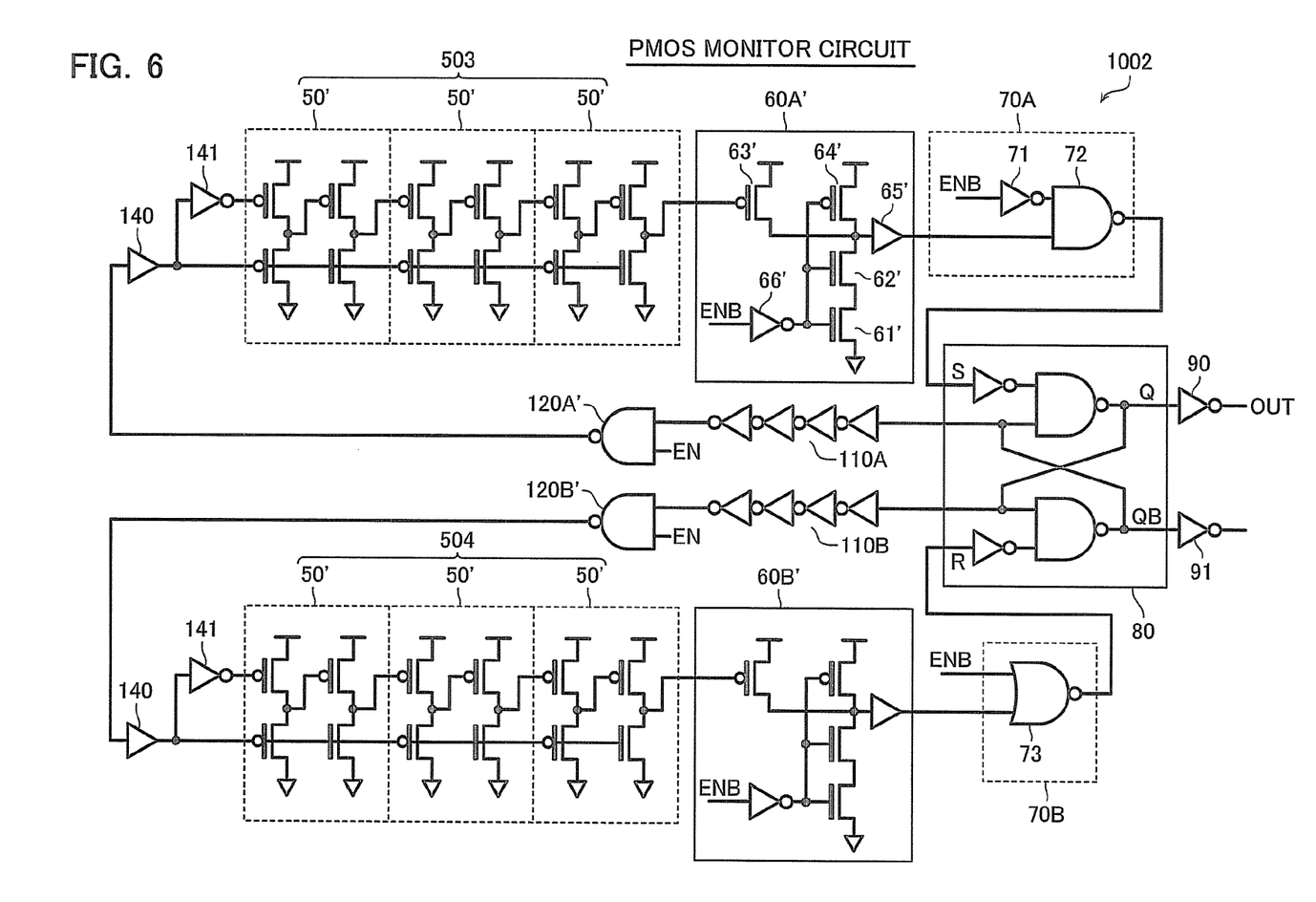
FIG. 6 shows an application example of the PMOS delay circuit 50'

FIG. 6 shows the configuration of a PMOS monitor circuit 1002 configured by using the PMOS delay circuit 50' according to the present embodiment. The PMOS monitor circuit 1002 includes two lines of inverter chain circuits 503 and 504 each configured by concatenating a plurality of such PMOS delay circuits 50' as described above. Other than these, the PMOS monitor circuit 1002 includes buffer circuits 60A' and 60B', gate circuits 70A and 70B, a sequential circuit 80, output buffers 90 and 91, delay circuits 110A and 110B, gate circuits 120A' and 120B', and buffer circuits 140 and inverters 141. Since the gate circuits 70A and 70B, the sequential circuit 80, the output buffers 90 and 91, and the delay circuits 110A and 110B are the same as those of the first embodiment (FIG. 4), explanation will not be given thereon.

The buffer circuits 60A' and 60B' have a configuration different from that of the buffer circuits 60A and 60B shown in FIG. 4. In FIG. 6, transistors 61' to 64' correspond to the transistors 61 to 64 of FIG. 4, and a gate circuit 65' corresponds to the inverter 65. The buffer circuits 60A' and 60B' additionally include an inverter 66' for inverting the inverted enable signal ENS. The difference in the operations of the corresponding transistors is based only on whether the transistors are p type or n type, and these transistors have the same basic operation and role. Therefore, the circuit as a whole operates in the same way, and hence detailed explanation will not be given on the operation of the circuit. The gate circuits 120A' and 120B' employ NAND gates. Since the operation of the PMOS monitor circuit 1002 is essentially the same as that of the NMOS monitor circuit 1001 of FIG. 4 and is obvious from the explanation on the operation of the NMOS monitor circuit 1001 given above, detailed explanation will not be given thereon.

Like the case of FIG. 4, the circuit configuration of FIG. 6 allows one of the inverter chain circuits 503 and 504 to be in signal propagation operation while the other is in a pre-charge operation, which brings about a state that the pre-charge time of one inverter chain circuit is concealed by the operation of the other, enabling to evaluate characteristic of PMOS transistors without being influenced by the characteristic of NMOS transistor for the same reason as that of FIG. 4.

[Third Embodiment]

Figure 7:
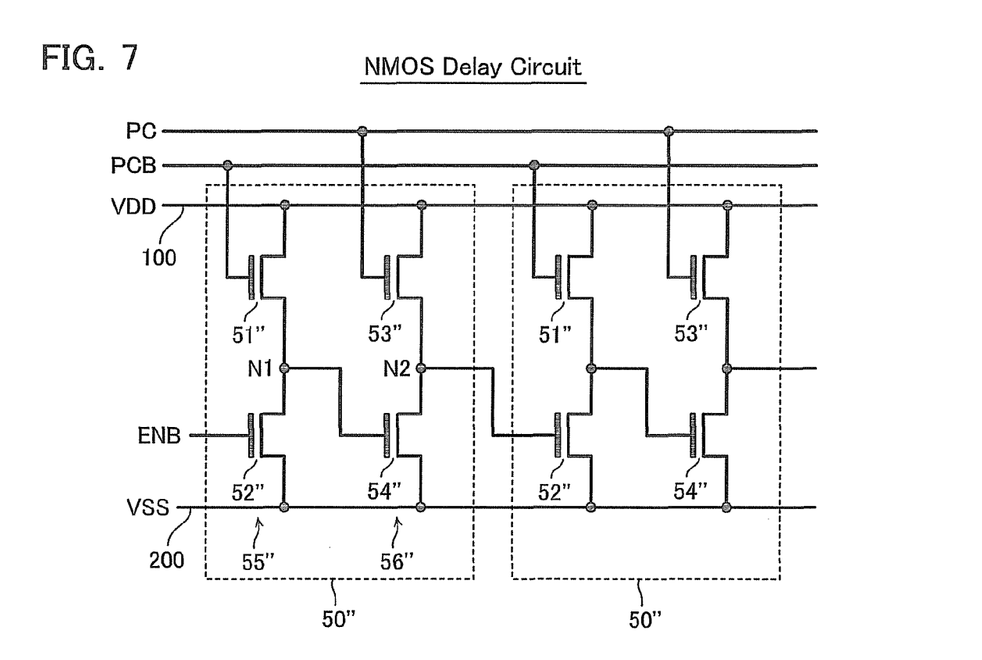
FIG. 7 is an equivalent circuit diagram showing configuration of an NMOS delay circuit 50" according to a third embodiment.

Next, a semiconductor integrated circuit according to a third embodiment of the present invention will be explained with reference to FIG. 7. FIG. 7 is an equivalent circuit diagram showing the configuration of an NMOS delay circuit 50" according to a semiconductor integrated circuit of the third embodiment.

As shown in FIG. 7, the NMOS delay circuit 50" includes four transistors 51" to 54". A plurality of such NMOS delay circuits 50" each including four transistors 51" to 54" are connected in cascade, thus configuring an inverter chain circuit. Since all of the plurality of NMOS delay circuits 50" have the same configuration, the configuration of the first NMOS delay circuit 50" will be explained below. The transistors 51" to 54" are all NMOS transistors.

The transistor 53" functions as a pre-charge transistor similar to that of the foregoing embodiment. In the present embodiment, both a pre-charge signal PC and an inverted pre-charge signal PCB are input to the NMOS delay circuit. The transistor 51" is controlled by the inverted pre-charge signal PCB, and the transistor 53" is controlled by the pre-charge signal PC.

Accordingly, conductive and non-conductive states of the transistors 51" and 53" can be controlled in a way similar to how the transistors 51 and 53 of the first embodiment are controlled, enabling similar pre-charge and signal propagation operations to be executed. Hence, it is possible to monitor characteristic of NMOS transistors by using the inverter chain circuit configured by the NMOS delay circuits 50". In the circuit of FIG. 7, if the voltage of the supply voltage terminal 100 is the supply voltage VDD, the nodes N1 and N2 do not rise above a voltage VDD-Vth. However, a similar signal propagation operation is available. Further, by allowing the amplitude of the pre-charge signal PC and the inverted pre-charge signal PCB to range between the voltage VDD+Vth and the voltage VSS, it becomes possible to pre-charge the nodes N1 and N2 up to the supply voltage VDD.

In FIG. 7, it is also possible to replace all the NMOS transistors with PMOS transistors.

[Fourth Embodiment]

Figure 8:
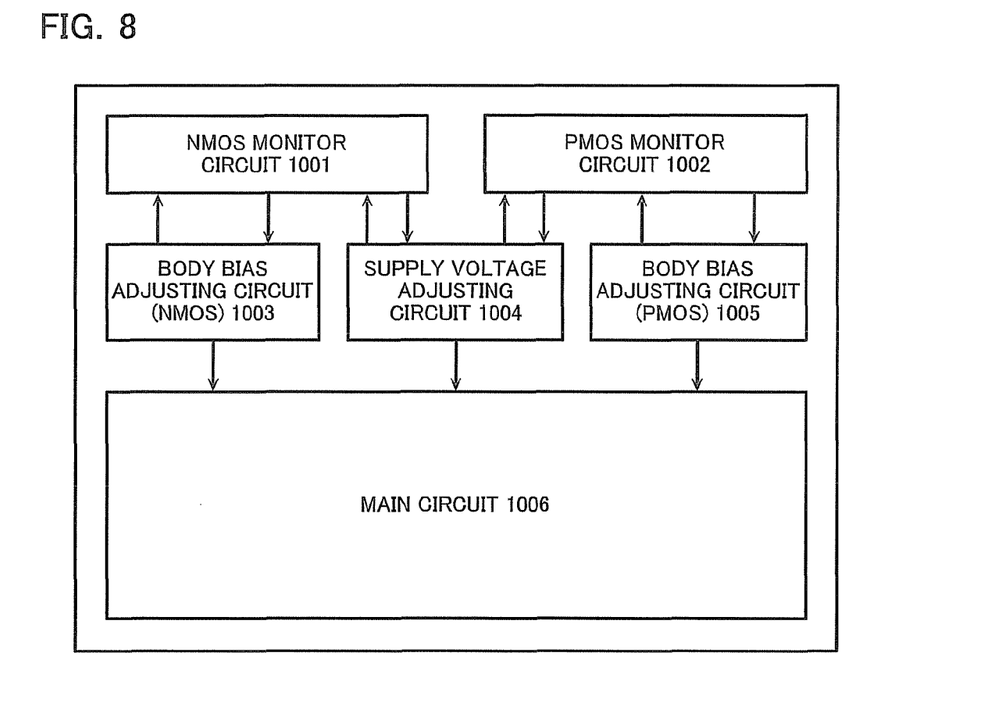
FIG. 8 shows a semiconductor integrated circuit according to a fourth embodiment.

A semiconductor integrated circuit according to a fourth embodiment of the present invention will be explained with reference to FIG. 8. According to the present embodiment, an NMOS monitor circuit 1001 such as shown in FIG. 4 and a PMOS monitor circuit 1002 such as shown in FIG. 6 are used on a semiconductor chip such that an NMOS body bias adjusting circuit 1003, a supply voltage adjusting circuit 1004, and a PMOS body bias adjusting circuit 1005 are controlled in accordance with the output signals of these monitor circuits and whereby the supply voltage and the body bias are adjusted. FIG. 8 is one application example of the monitor circuits 1001 and 1002, and needless to say, the present invention is not limited to this application example.

[Fifth Embodiment]

Next, a semiconductor integrated circuit according to a fifth embodiment of the present invention will be explained with reference to FIG. 9. An NMOS delay circuit according to the present embodiment has the same basic configuration as that of the NMOS delay circuit of FIG. 1. However, according to the present embodiment, a NMOS transistor 51 and a PMOS transistor 53 are each configured by a plurality of transistors connected in series. That is, the drive power of the PMOS transistors 53 becomes lower than that of the NMOS transistor 54, etc., and hence a penetrating current that might occur in a pre-charge operation can be suppressed. Since the drive power of the NMOS transistors 51 also becomes lower than that of the NMOS transistor 52, a penetrating current in a signal propagation operation can be suppressed.

[Sixth Embodiment]

Next, a semiconductor integrated circuit according to a sixth embodiment of the present invention will be explained with reference to FIG. 10. The present embodiment is different from the fifth embodiment in that the transistors 51 are supplied with a supply voltage VDD at the gate thereof, and hence constantly in an ON state regardless of a pre-charge signal PC.

The potential of the node N1 is "L" even during a pre-charge operation (i.e., even when the transistors 53 are conductive) due to the difference in the drive power between the transistors 51 and 52, whereby the transistor 54 becomes non-conductive, enabling to pre-charge the node N2 up to the supply voltage VDD.

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 9:
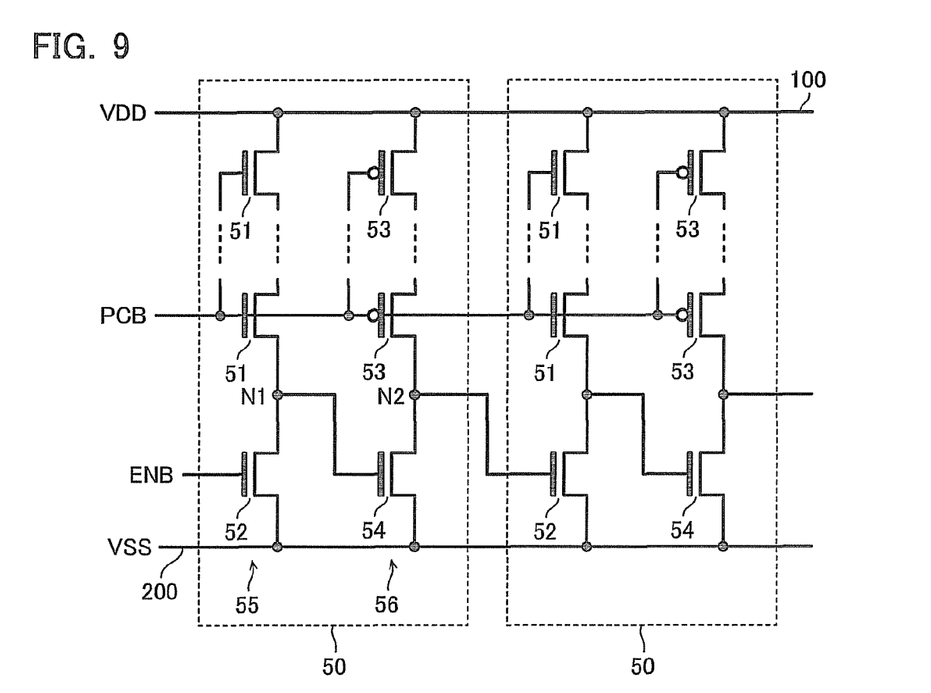
FIG. 9 is an equivalent circuit diagram showing configuration of an NMOS delay circuit 50 according to a fifth embodiment.
Figure 10:
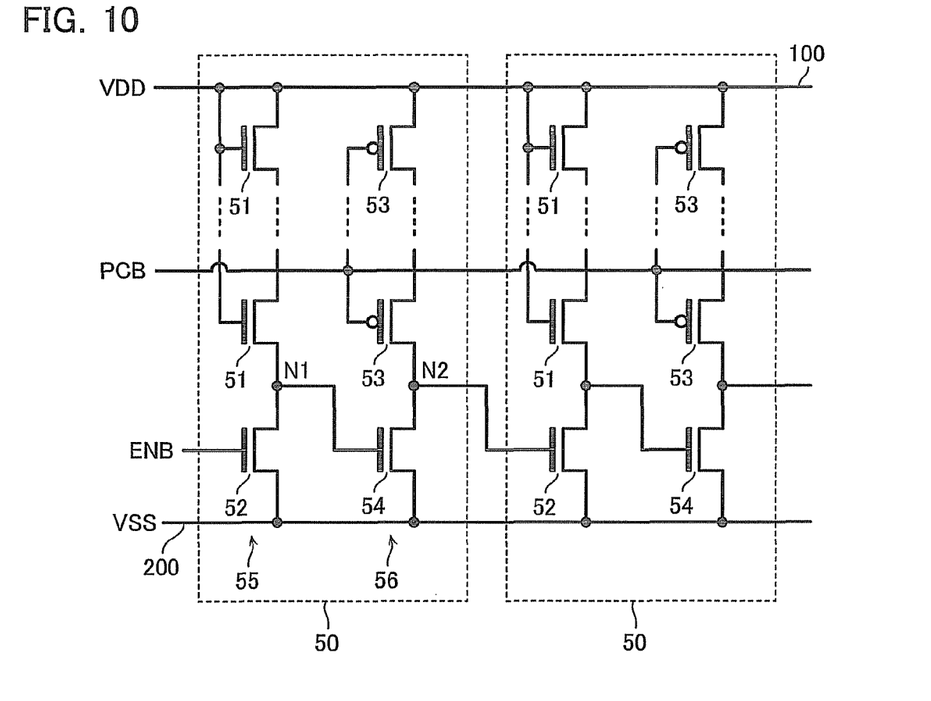
FIG. 10 is an equivalent circuit diagram showing configuration of an NMOS delay circuit 50 according to a sixth embodiment.

For example, the configurations shown in FIG. 9 and FIG. 10 can be employed also in a PMOS delay circuit.

Figure 11:
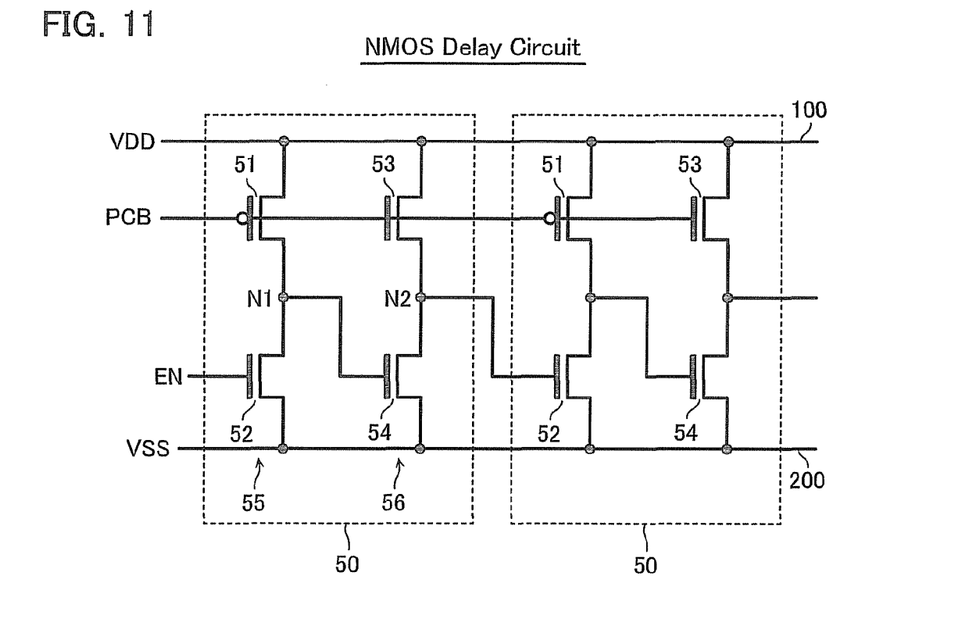
FIG. 11 shows a modified example of an embodiment of the present invention.

In the above embodiments, examples in which pre-charge transistors are provided in inverters located at even-number orders seen from an input terminal side has been explained. However, pre-charge transistors may be provided in inverters located at odd-number orders. For example, as shown in FIG. 11, transistors 51 may be PMOS transistors to function as pre-charge transistors, while transistors 53 may be NMOS transistors for characteristic evaluation. In this case, the signal to be input to a transistor 52 is not an inverted enable signal ENB but an enable signal EN.

Figure 12:
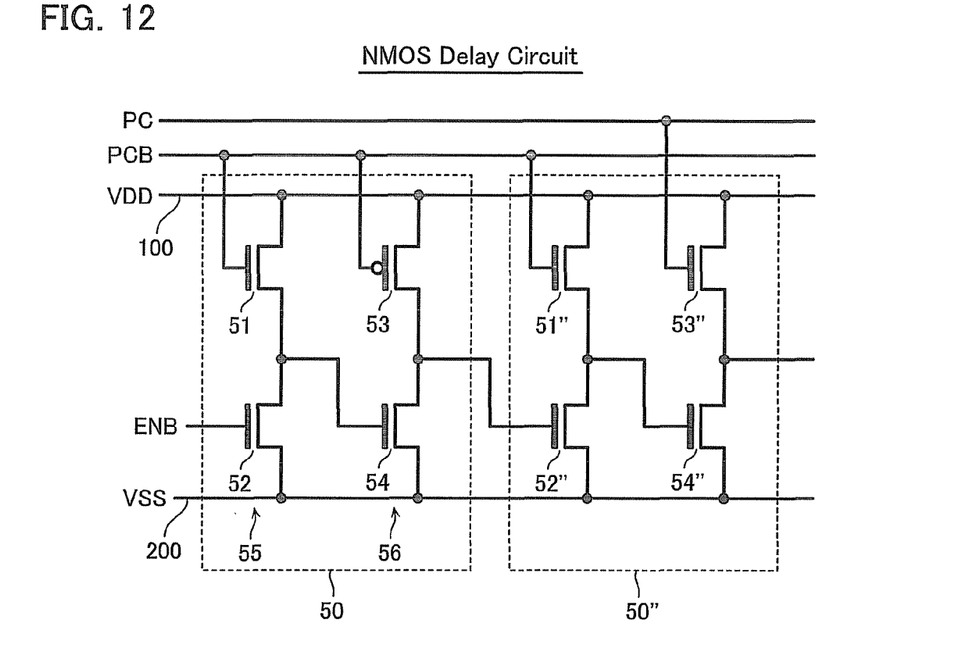
FIG. 12 shows a modified example of an embodiment of the present invention.

A delay circuit 50 such as shown in FIG. 1 and a delay circuit 50" such as shown in FIG. 7 may be mixed within the same inverter chain circuit (see FIG. 12). In sum, it is only necessary that all or most of the transistors that become conductive during a signal propagation operation be transistors of the same conductivity type. If so, it is possible to measure characteristic of the transistors of the same conductivity type individually and accurately. Therefore, the transistors that become conductive during a pre-charge operation may be of any conductivity type.

What is claimed is:

1. A semiconductor integrated circuit, comprising:
a first terminal supplied with a first voltage;
a second terminal supplied with a second voltage having a value different from that of the first voltage; and
an inverter chain circuit including a plurality of inverters connected in cascade,
each of the plurality of inverters being including:
a first transistor having one end connected to the first terminal; and
a second transistor having one end connected to the second terminal and the other end connected to the other end of the first transistor,
the plurality of inverters being connected in cascade with an output terminal of the inverter at a preceding stage connected to a control terminal of the second transistor in the inverter at a succeeding stage,
the first transistors included in the inverters located at either odd-number orders or even-number orders counted from an input terminal side of the inverter chain circuit being functioning as pre-charge transistors configured to become conductive when a pre-charge signal has a first state to pre-charge the other end of the first transistors and to become non-conductive when the pre-charge signal has a second state,
the first transistors other than the pre-charge transistors being configured to become non-conductive when the pre-charge signal has the first state and to become conductive when the pre-charge signal has the second state, and
the pre-charge transistors having a conductivity type different from that of the first transistors other than the pre-charge transistors.

2. The semiconductor integrated circuit according to claim 1, wherein the first transistors other than the pre-charge transistors, and the second transistors are transistors of a same conductivity type.

3. A semiconductor integrated circuit comprising:
a first terminal supplied with a first voltage;
a second terminal supplied with a second voltage having a value different from that of the first voltage; and
an inverter chain circuit including a plurality of inverters connected in cascade,
each of the plurality of inverters including:
a first transistor having one end connected to the first terminal; and
a second transistor having one end connected to the second terminal and the other end connected to the other end of the first transistor,
the plurality of inverters being connected in cascade with an output terminal of the inverter at a preceding stage connected to a control terminal of the second transistor in the inverter at a succeeding stage,
the first transistors included in the inverters located at either odd-number orders or even-number orders counted from an input terminal side of the inverter chain circuit being functioning as pre-charge transistors configured to become conductive when a pre-charge signal has a first state to pre-charge the other end of the first transistors and to become non-conductive when the pre-charge signal has a second state,
the first transistors other than the pre-charge transistors being configured to become non-conductive when the pre-charge signal has the first state and to become conductive when the pre-charge signal has the second state,
all of the first transistors and the second transistors configuring the inverter chain circuit being transistors of the same conductivity type,
gates of the pre-charge transistors being connected to the pre-charge signal, and
gates of the first transistors other than the pre-charge transistors being connected to an inverted signal of the pre-charge signal.

4. The semiconductor integrated circuit according to claim 3, wherein the first transistors are each configured by a plurality of transistors connected in series.

5. The semiconductor integrated circuit according to claim 3, wherein the second transistors connected in series to the pre-charge transistors become non-conductive when the pre-charge signal has the first state and become conductive when the pre-charge signal has the second state.

6. The semiconductor integrated circuit according to claim 5,
wherein the pre-charge transistors have a conductivity type different from that of the first transistors other than the pre-charge transistors.

7. The semiconductor integrated circuit according to claim 6,
wherein the first transistors other than the pre-charge transistors, and the second transistors are transistors of a same conductivity type.

8. The semiconductor integrated circuit according to claim 3,
wherein the second transistor included in the inverter located at a first order in the inverter chain circuit is supplied, at a gate thereof, with an operation start signal for starting a signal propagation operation of the inverter chain circuit.

9. A semiconductor integrated circuit, comprising:
a first terminal supplied with a first voltage;
a second terminal supplied with a second voltage having a value different from that of the first voltage;
an inverter chain circuit including a plurality of inverters connected in cascade,
each of the plurality of inverters including:
a first transistor having one end connected to the first terminal; and
a second transistor having one end connected to the second terminal and the other end connected to the other end of the first transistor;
a first signal delay circuit including the inverter chain circuit and configured to delay an input signal to output a first signal;
a second signal delay circuit including the inverter chain circuit and configured to delay an input signal to output a second signal;
a sequential circuit configured to generate an output signal determined by the first signal and the second signal;
a first delay circuit configured to delay the output signal to output a first control signal; and
a second delay circuit configured to delay an inverted signal of the output signal to output a second control signal,
the plurality of inverters being connected in cascade with an output terminal of the inverter at a preceding stage connected to a control terminal of the second transistor in the inverter at a succeeding stage,
the first transistors included in the inverters located at either odd-number orders or even-number orders counted from an input terminal side of the inverter chain circuit being functioning as pre-charge transistors configured to become conductive when a pre-charge signal has a first state to pre-charge the other end of the first transistors and to become non-conductive when the pre-charge signal has a second state,
the first transistors other than the pre-charge transistors being configured to become non-conductive when the pre-charge signal has the first state and to become conductive when the pre-charge signal has the second state,
the first signal delay circuit making the pre-charge transistors non-conductive in accordance with the input signal while the second signal delay circuit makes the pre-charge transistors conductive to execute an operation of pre-charging the other end of the first transistors, and
the second signal delay circuit making the pre-charge transistors non-conductive in accordance with the input signal while the first signal delay circuit makes the pre-charge transistors conductive to execute an operation of pre-charging the other end of the first transistors.

10. The semiconductor integrated circuit according to claim 9,
wherein the pre-charge transistors have a conductivity type different from that of the first transistors other than the pre-charge transistors.

11. The semiconductor integrated circuit according to claim 10,
wherein the first transistors other than the pre-charge transistors, and the second transistors are transistors of a same conductivity type.

12. The semiconductor integrated circuit according to claim 9,
wherein the second transistors connected in series to the pre-charge transistors become non-conductive when the pre-charge signal has the first state and become conductive when the pre-charge signal has the second state.

13. The semiconductor integrated circuit according to claim 12,
wherein the pre-charge transistors have a conductivity type different from that of the first transistors other than the pre-charge transistors.

* * * * *